United States Patent
Sugawara et al.

(10) Patent No.: US 7,622,402 B2
(45) Date of Patent: Nov. 24, 2009

(54) METHOD FOR FORMING UNDERLYING INSULATION FILM

(75) Inventors: Takuya Sugawara, Nirasaki (JP); Yoshihide Tada, Nirasaki (JP); Genji Nakamura, Nirasaki (JP); Shigenori Ozaki, Amagasaki (JP); Toshio Nakanishi, Amagasaki (JP); Masaru Sasaki, Amagasaki (JP); Seiji Matsuyama, Amagasaki (JP); Kazuhide Hasebe, Nirasaki (JP); Shigeru Nakajima, Nirasaki (JP); Tomonori Fujiwara, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 267 days.

(21) Appl. No.: 10/509,371

(22) PCT Filed: Mar. 31, 2003

(86) PCT No.: PCT/JP03/04125

§ 371 (c)(1), (2), (4) Date: May 27, 2005

(87) PCT Pub. No.: WO03/088341

PCT Pub. Date: Oct. 23, 2003

(65) Prior Publication Data

US 2005/0255711 A1    Nov. 17, 2005

(30) Foreign Application Priority Data

Mar. 29, 2002 (JP) ............................ 2002-097845

(51) Int. Cl.
*H01L 21/31* (2006.01)

(52) U.S. Cl. ................ 438/788; 438/761; 438/770; 438/775; 257/E21.082; 257/E21.284; 257/E21.302

(58) Field of Classification Search ............... 438/765, 438/771, 776; 257/E21.082, E21.282, E21.283, 257/E21.284, E21.301, E21.302, E21.331
See application file for complete search history.

(56) References Cited

U.S. PATENT DOCUMENTS 6,228,779 B1 * 5/2001 Bloom et al. ............... 438/763

(Continued)

FOREIGN PATENT DOCUMENTS

EP        0 046 868 A     3/1982

(Continued)

OTHER PUBLICATIONS

Callegari A et al., "Physical and electrical characterization of Hafnium oxide and Hafnium silicate sputtered films", Journal of Applied Physics, American Institute of Physics, New York, US, vol. 90 No. 12, Dec. 15, 2001 (pp. 6466-6475).

(Continued)

*Primary Examiner*—Savitri Mulpuri
*Assistant Examiner*—Cheung Lee
(74) *Attorney, Agent, or Firm*—Crowell & Moring LLP

(57) ABSTRACT

The surface of an insulating film disposed on an electronic device substrate is irradiated with plasma based on a process gas comprising at least an oxygen atom-containing gas, to thereby form an underlying film at the interface between the insulating film and the electronic device substrate. A good underlying film is provided at the interface between the insulating film and the electronic device substrate, so that the thus formed underlying film can improve the property of the insulating film.

19 Claims, 11 Drawing Sheets

U.S. PATENT DOCUMENTS

| | | |
|---|---|---|
| 6,245,616 B1 * | 6/2001 | Buchanan et al. ............ 438/287 |
| 6,291,867 B1 | 9/2001 | Wallace et al. |
| 6,436,777 B1 * | 8/2002 | Ota ............................ 438/305 |
| 6,497,783 B1 * | 12/2002 | Suzuki et al. ............. 156/345.1 |
| 2001/0036752 A1 | 11/2001 | Deboer et al. |
| 2002/0014666 A1 | 2/2002 | Ohmi et al. |
| 2002/0137239 A1 * | 9/2002 | Koyanagi ..................... 438/16 |
| 2004/0110361 A1 * | 6/2004 | Parker et al. ................. 438/484 |

FOREIGN PATENT DOCUMENTS

| | | |
|---|---|---|
| JP | 5-221644 | 8/1993 |
| JP | 11-293470 | 10/1999 |
| JP | 2000-294550 | 10/2000 |
| JP | 2001-111000 | 4/2001 |
| WO | WO 01/99166 A | 12/2001 |

OTHER PUBLICATIONS

European Supplemental Search Report dated Apr. 11, 2006.
Japanese Office Action dated Mar. 6, 2007 (three (3) pages).

* cited by examiner

METHOD FOR FORMING UNDERLYING INSULATION FILM

TECHNICAL FIELD

The present invention relates to a process for forming an insulating film having a good interfacial property. More specifically, the present invention relates to a method of irradiating an insulating film with plasma based on a process gas comprising at least an oxygen atom-containing gas, to thereby improve the interfacial property between the insulating film and the substrate. The modification process according to the present invention is suitably usable, particularly for a so-called high-k (high-dielectric constant) material.

BACKGROUND ART

In general, the present invention is widely applicable to the production of materials for electronic device such as semiconductors or semiconductor devices, and liquid crystal devices. For the convenience of explanation, however, the background art relating to semiconductor devices as an example of the electronic devices, will be described here.

Substrates for semiconductors or electronic device materials such as silicon have been subjected to various kinds of treatments such as formation of an oxide film, film formation by CVD (chemical vapor deposition), etc., and etching. According to the recent requirement for forming microstructures and attaining further development in the performances in the field of semiconductor devices, the demand for an insulating film having a higher performance (for example, in view of leakage current) has been increased remarkably. This is because the leakage current of a certain degree can cause a severe problem in the recent devices which have attained finer structures, and/or higher performances, even when the leakage current of such a degree have actually caused substantially no problem in the conventional devices having a lower degree of integration. Particularly, in view of the development in the mobile or portable-type electronic devices in a so-called "ubiquitous" society of recent construction (i.e., information-oriented society wherein people can use a network service, anytime and anywhere, by means of electronic devices), it is necessary to develop a low-power consumption device, and therefore the reduction in the leakage current is an extremely important issue.

Typically, in a case where the formation of a finer structure in a high-performance silicon LSI is pursued, for example, for the purpose of developing a next-generation MOS-type transistor, there arises her performance a problem that the leakage current is increased and the resultant power consumption is also increased. Accordingly, in order to decrease the power consumption thereof while pursuing a higher performance, it is necessary to improve the transistor characteristic without increasing the gate leakage current in the MOS-type transistor.

In order to satisfy this requirement, various techniques (for example, the modification of a silicon oxide film and the use of a silicon oxynitride film SiON) have been proposed. Among these, one useful technique is the development of an insulating film using a high-k (high-dielectric constant) material. This is because the use of such a high-k material is expected to reduce the EOT (effective oxide thickness), which is an $SiO_2$ capacity-equivalent film thickness.

However, when such an insulating film, which has been expected to provide a good property, is actually formed by CVD (chemical vapor deposition method) or the like, particularly in the case of the formation of an insulating film having a very high practical utility (for example, a relatively thin insulating film of about 12 A (angstrom)), a good interfacial property can be hardly obtained between the insulating film and the underlying electronic device substrate.

One promising method for solving such a problem may be to form a very thin (for example, 10 A or less) underlying film on a substrate, and to form an insulating film on the underlying film. However, it is very difficult to form such a thin underlying film directly on an electronic device substrate by using a conventional thermal oxidation or plasma oxidation technique (the thickness of a thin film can be hardly controlled by such a technique), while controlling the film-forming rate or in-plane uniformity.

DISCLOSURE OF INVENTION

An object of the present invention is to provide a process for forming an underlying film, which has solved the problem encountered in the prior art.

Another object of the present invention is to provide a process capable of forming a good underlying film at the interface between an insulating film and an electronic device substrate so as to improve the resultant transistor characteristic.

As a result of earnest study, the present inventors have found that, when an insulating film (for example, high-k material film) is once formed on an electronic device substrate and plasma based on a process gas comprising at least an oxygen atom-containing gas is caused to pass through the insulating film so as to form an underlying film at the insulating film-substrate interface, such a process is extremely effective in achieving the above-mentioned object, unlike the conventional technique wherein an underlying film is formed on an electronic device substrate and then an insulating film (for example, high-k material film) is formed thereon.

The process for forming underlying insulating film according to the present invention is based on the above discovery. More specifically, the process comprises: irradiating the surface of an insulating film disposed on an electronic device substrate with plasma based on a process gas comprising at least an oxygen atom-containing gas, to thereby form an underlying film at the interface between the insulating film and the electronic device substrate.

The present invention also provides an electronic device material, comprising: an electronic device substrate, an underlying film disposed on the substrate, and an insulating film disposed on the underlying film, wherein the underlying film is a film which has been formed by supplying plasma from the insulating layer side.

In the process for forming an underlying film according to the present invention having such a constitution, active plasma species (for example, oxygen reactive species) are caused to pass through the insulating film from the insulating film surface side to reach the insulating film-substrate interface, to thereby form an underlying film in the vicinity of the interface. In the present invention, the film-forming rate can be controlled (that is, the film-forming time can be controlled) easily, as compared with the case wherein an underlying film is directly formed on an electronic device substrate. Accordingly, in the present invention, it is easy to control the thickness of the underlying film and/or to improve the in-plane uniformity of the underlying film.

BEST MODE FOR CARRYING OUT THE INVENTION

Figure 1A:
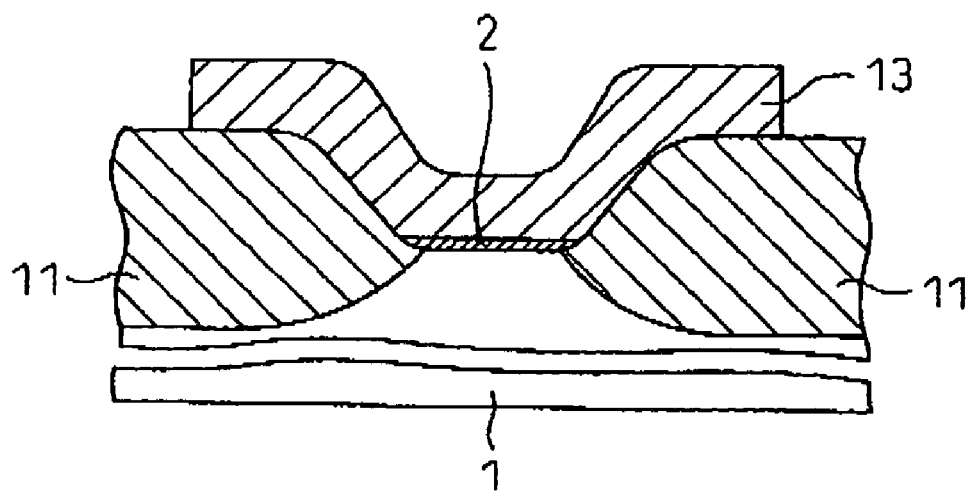
FIG. 1 is a schematic vertical sectional view showing an example of the semiconductor device, which can be produced by the process for forming an underlying insulating film according to the present invention.

Hereinbelow, the present invention will be described in detail, with reference to the accompanying drawings as desired. In the following description, "%" and "part(s)" representing a quantitative proportion or ratio are those based on mass, unless otherwise specifically noted.

(Process for Forming Underlying Film)

In the present invention, the surface of an insulating film disposed on an electronic device substrate is irradiated with plasma based on a process gas comprising at least an oxygen atom-containing gas, to thereby form an underlying film at the interface between the insulating film and the electronic device substrate.

(Insulating Film)

The material for constituting the insulating film, which is usable in the present invention, is not particularly limited. In view of a practical MOS-type transistor, it is preferred to use one or at least two materials selected from the group consisting of: $SiO_2$, SiON, each having a low dielectric constant, SiN having a relatively high dielectric constant, and substances having a high dielectric constant, which are called a "high-k substance" as described later.

(High-k Material)

The high-k material, which is usable in the present invention is not particularly limited. In view of the trend for an MOS-type transistor at a practical level, it is preferred to use those having a "k" (dielectric constant) value of 8 or more, more preferably 10 or more.

Preferred examples of such a high-k material may include, one or at least two materials selected from the group consisting of: $Al_2O_3$, $ZrO_2$, $HfO_2$, $Ta_2O_5$, silicates such as ZrSiO and HfSiO, and aluminates such as ZrAlO, can be suitably used.

(Electronic Device Substrate)

The electronic device substrate which is usable in the present invention is not particularly limited. It is possible to use one or combination of at least two species, which are selected from the known electronic device substrates. Specific examples of the electronic device substrate may include a semiconductor material, a liquid crystal device material, etc. Specific examples of the semiconductor material may include: materials mainly comprising single-crystal silicon, and high performance CMOS, etc.

(Underlying Film)

The composition, thickness, stacking or lamination form, etc., of the underlying film are not particularly limited, as long as the interfacial property of the above-mentioned insulating film can be improved. In view of transistor characteristic, the underlying film may preferably be an underlying oxide film.

The underlying film may preferably have a thickness of about 6 to 12 Å, more preferably about 6 to 8 Å.

(Process Gas Conditions)

In the formation of the underlying film according to the present invention, the following conditions can be suitably used in view of property of the underlying film to be formed.

Rare Gas (for example, Kr, Ar, He or Xe):
  from 300 to 2,000 sccm, more preferably from 1,000 to 2,000 sccm $O_2$: from 1 to 500 sccm, more preferably from 10 to 300 sccm Temperature:
  from room temperature (25° C.) to 500° C., more preferably from 250 to 500° C., still more preferably from 250 to 400° C.

Pressure:
  from 3 to 500 Pa, more preferably from 7 to 260 Pa

Microwave:
  from 1 to 5 W/CM$^2$, more preferably from 2 to 4 W/cm$^2$, still more preferably from 2 to 3 W/cm$^2$ (Annealing)

In the present invention, after the above-mentioned modification, the insulating film may be subjected to annealing, as desired. The conditions for the annealing are not particularly limited. In view of the transistor characteristic, a process gas containing an $O_2$ gas and/or an $N_2$ gas is suitably usable. Examples of the conditions, which are suitably usable in the present invention, are described below.

(Suitable Annealing Conditions)
   Rare Gas (for example, Kr, Ar, He or Xe):
      from 0 to 5,000 sccm, more preferably from 0 to 1,000 sccm
   $O_2$: from 10 to 1,000 sccm, more preferably from 10 to 100 sccm
   $N_2$: from 1,000 to 5,000 sccm, more preferably from 1,000 to 3,000 sccm
   Temperature:
      from room temperature (25° C.) to 1,050° C., more preferably from 600 to 1,050° C.
   Pressure:
      from 100 to 101 kPa, more preferably from 1 k to 101 kPa The plasma which is usable in the present invention is not particularly limited. It is preferred to use a high-density plasma having a relatively low electron temperature, because it may easily provide a uniform thin film.

(Suitable Plasma)

The property of the plasma which is suitably usable in the present invention are as follows.
   Electron temperature: 0.5-2.0 eV
   Density: from 1E10 to 5E12/$cm^3$
   Uniformity of plasma density: ±10%

(Plane Antenna Member)

In the process for forming an electronic device material according to the present invention, plasma having a low electron temperature and a high density is formed by supplying microwave via a plane antenna member having a plurality of slots. In the present invention, the film is formed by using the plasma having such an excellent characteristic, and therefore the present invention can provide a process which accomplishes a light plasma damage, and a high reactivity at a low temperature. Further, in the present invention, as compared with a case using conventional plasma, a high-quality insulating film may easily be formed by supplying microwave via a plane antenna member.

According to the present invention, a high-quality underlying film can be formed. Accordingly, a semiconductor device structure having an excellent characteristic may easily be formed by forming another layer (for example, an electrode layer) on the underlying film.

(Preferred Characteristic of Underlying Film)

According to the present invention, an underlying film having the following preferred characteristic can easily be formed.

(Preferred Characteristic of Semiconductor Structure)

The extent to which the process according to the present invention is applicable is not particularly limited, but the high-quality underlying film formable by the present invention can suitably be used, particularly as a gate insulator constituting an MOS structure.

(Preferred Characteristic of MOS Semiconductor Structure)

The very thin underlying film having a good quality, which is formable by the present invention, can suitably be used particularly as an insulating film constituting a semiconductor device (particularly, as a gate insulator constituting an MOS semiconductor structure).

According to the present invention, an MOS semiconductor structure having the following preferred characteristic can easily be produced. When the characteristic of the insulating film which has been modified by the present invention may be evaluated, for example, by a method wherein a standard MOS semiconductor structure as described in a publication (see, Masanori Kishino and Mitsumasa Koyanagi, "VLSI Device no Butsuri (Physics of VLSI Devices)", pp. 62-63, published by Maruzen) is fabricated and the evaluation of the characteristic of the thus fabricated MOS can be used as the evaluation of the characteristic of the insulating film itself. This is because, in such a standard MOS structure, the characteristic of the insulating film constituting the MOS structure has much effect on the MOS characteristic.

One Embodiment of Production Apparatus

One preferred embodiment of the production process according to the present invention is described below.

First, as an example of the structure of a semiconductor device which can be produced by the process for producing an electronic device material according to the present invention, a semiconductor device having an MOS structure having a gate insulator as the insulating film is described below, with reference to FIG. 1.

Figure 1B:
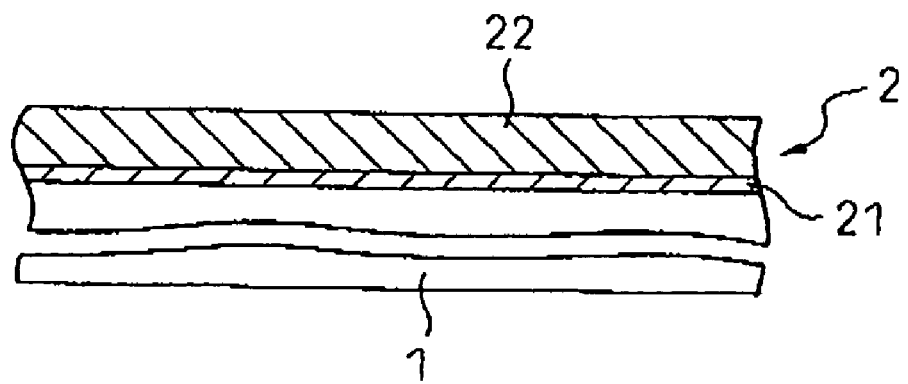

Referring to FIG. 1(a), the reference numeral 1 in this FIG. 1(a) denotes a silicon substrate, numeral 11 denotes a field oxide film, numeral 2 denotes a gate insulator and numeral 13 denotes a gate electrode. Referring to FIG. 1(b), this gate insulator 2 comprises an underlying oxide film 21 and a high-k substance 22. As described above, the production process according to the present invention may provide a very thin underlying oxide film 21 having a good quality.

In this example, it is preferred that the high-quality underlying oxide film 21 comprises a silicon oxide film (hereinafter referred to as "$SiO_2$ film") which has been formed by irradiating a substrate to be treated mainly comprising Si, with a microwave through a plane antenna member having a plurality of slots in the presence of a process gas comprising $O_2$ and a rare gas so as to generate plasma, and forming the oxide film at the surface between the high-k substance and the substrate by using the thus generated plasma. When such underlying $SiO_2$ is used, as described hereinafter, it is easy to obtain a good Si/gate insulator interfacial property (such as interfacial level), and a good gate leakage characteristic.

One Embodiment of Production Process

Next, the process for producing such an electronic device material comprises a gate insulator 2 and a gate electrode 13 is described below.

Figure 2:
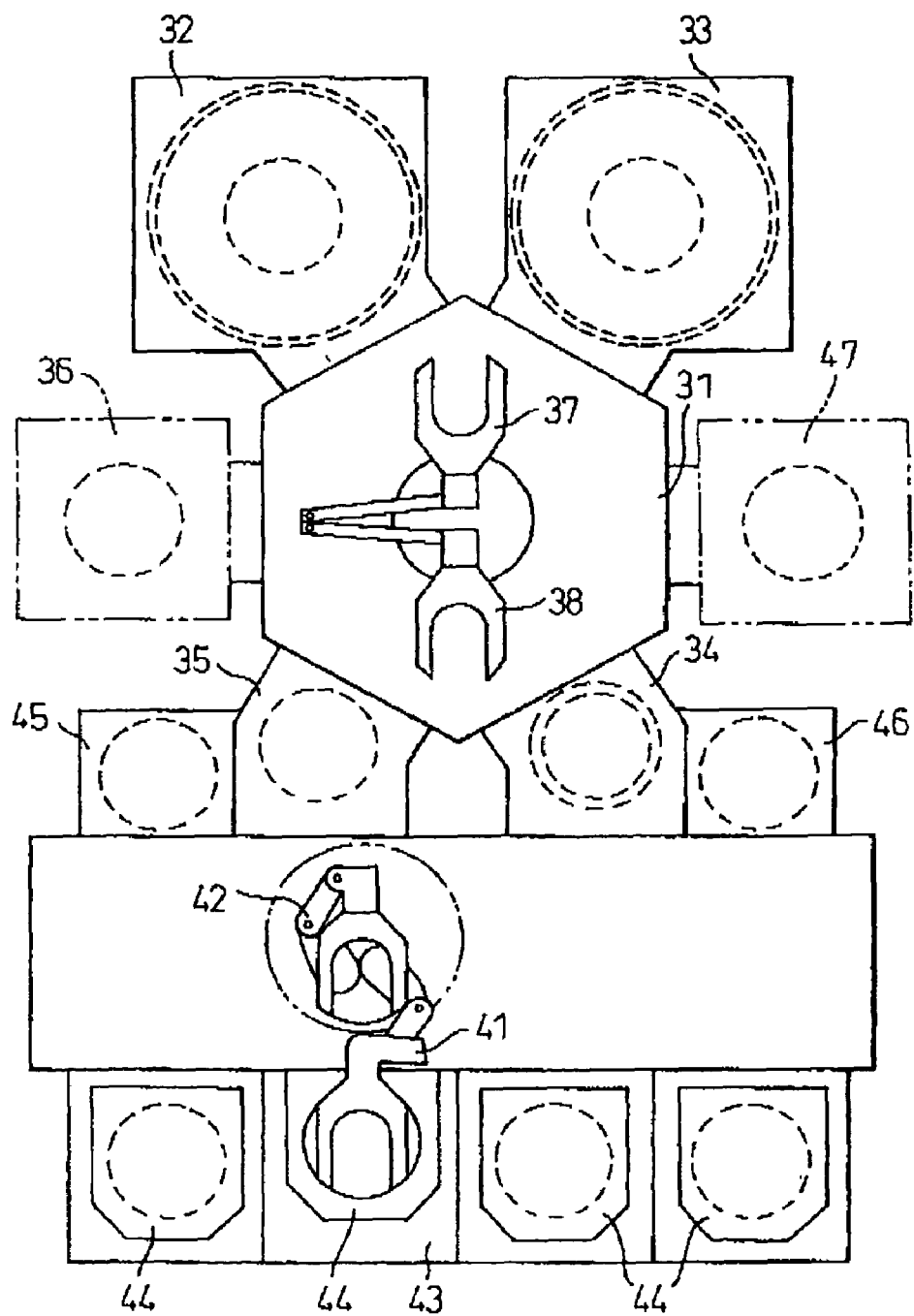
FIG. 2 is a schematic vertical sectional view showing an example of the semiconductor-fabricating apparatus for practicing the process for forming an underlying insulating film according to the present invention.

FIG. 2 is schematic view (schematic plan view) showing an example of the total arrangement of a semiconductor manufacturing equipment 30 for conducting the process for producing an electronic device material according to the present invention.

As shown in FIG. 2, in a substantially central portion of the semiconductor manufacturing equipment 30, there is disposed a transportation chamber 31 for transporting a wafer W (FIG. 2). Around the transportation chamber 31, there are disposed: plasma processing units 32 and 33 for conducting various treatments on the wafer, two load lock units 34 and 35 for conducting the communication/cutoff between the respective processing chambers, a heating unit 36 for operating various heating treatments, and a heating reaction furnace 47 for conducting various heating treatments on the wafer. These units are disposed so as to surround the transportation chamber 31. Alternatively, it is also possible to provide the heating reaction furnace 47 independently and separately from the semiconductor manufacturing equipment 30.

On the side of the load lock units 34 and 35, a preliminary cooling unit 45 and a cooling unit 46 for conducting various kinds of preliminary cooling and cooling treatments are disposed.

In the inside of transportation chamber 31, transportation arms 37 and 38 are disposed, so as to transport the wafer W (FIG. 3) between the above-mentioned respective units 32-36.

On the foreground side of the load lock units 34 and 35 in this figure, loader arms 41 and 42 are disposed. These loader arms 41 and 42 can put wafer W in and out with respect to four cassettes 44 which are set on the cassette stage 43, which is disposed on the foreground side of the loader arms 41 and 42.

In FIG. 2, as the plasma processing units 32 and 33, two plasma processing units of the same type are disposed in parallel.

Further, it is possible to exchange both of the plasma processing units 32 and 33 with a single-chamber type CVD process unit, It is possible to set one or two of such a single-chamber type CVD process unit in the position of plasma processing units 32 and 33.

When two plasma processing units 32 and 33 are used, it is possible that an oxidizing treatment is conducted in the plasma processing unit 32, and a nitriding treatment is conducted in the plasma processing unit 33. Alternatively, it is also possible that the oxidizing treatment and the nitriding treatment are conducted in parallel, in the plasma processing units 32 and 33.

One Embodiment of Plasma Processing Apparatus

Figure 3:
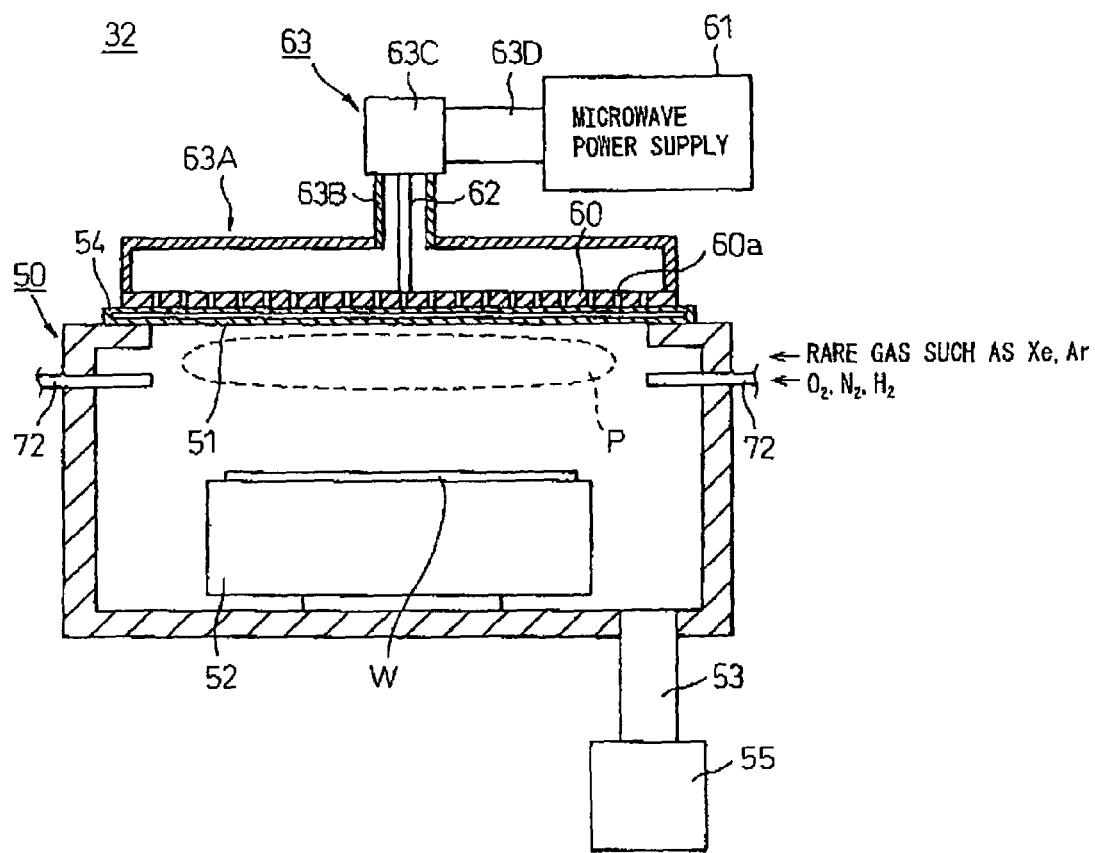
FIG. 3 is a schematic vertical sectional view showing an example of the plane antenna (RLSA; sometimes also referred to as "slot plane antenna" or "SPA") plasma processing unit, which is usable in the process for forming an underlying insulating film according to the present invention.

FIG. 3 is a schematic sectional view in the vertical direction showing the plasma processing unit 32 (or 33) which is usable in the film formation of the gate insulator 2.

Referring to FIG. 3, reference numeral 50 denotes a vacuum container made of, e.g., aluminum. In the upper portion of the vacuum container 50, an opening portion 51 is formed so that the opening portion 51 is larger than a substrate (for example, wafer W). A top plate 54 in a flat cylindrical shape made of a dielectric such as quartz and aluminum nitride so as to cover the opening portion 51. In the side wall of the upper portion of vacuum container 50 which is below the top plate 54, gas feed pipes 72 are disposed in the 16 positions, which are arranged along the circumferential direction so as to provide equal intervals therebetween. A process gas comprising at least one kind of gas selected from $O_2$, inert gas, $N_2$, $H_2$, etc., can be supplied into the vicinity of the plasma region P in the vacuum container 50 from the gas feed pipes 72 evenly and uniformly.

On the outside of the top plate 54, there is provided a radio-frequency power source, via a plane antenna member 60 having a plurality of slots, which comprises a plane antenna (RLSA) made from a copper plate, for example. As the radio-frequency power source, a waveguide 63 is disposed on the top plate 54, and the waveguide 63 is connected to a microwave power supply 61 for generating microwave of 2.45 GHz, for example. The waveguide 63 comprises a combination of: a flat circular waveguide 63A, of which lower end is connected to the RLSA 60; a circular waveguide 63B, one end of which is connected to the upper surface side of the circular waveguide 63A; a coaxial waveguide converter 63C connected to the upper surface side of the circular waveguide 63B; and a rectangular waveguide 63D, one end of which is connected to the side surface of the coaxial waveguide converter 63C so as to provide a right angle therebetween, and the other end of which is connected to the microwave power supply 61.

In the inside of the above-mentioned circular waveguide 63B, an axial portion 62 of an electroconductive material is coaxially provided, so that one end of the axial portion 62 is connected to the central (or nearly central) portion of the RLSA 60 upper surface, and the other end of the axial portion 62 is connected to the upper surface of the circular waveguide 63B, whereby the circular waveguide 63B constitutes a coaxial structure. As a result, the circular waveguide 63B is constituted so as to function as a coaxial waveguide.

In addition, in the vacuum container 50, a stage 52 for carrying the wafer W is provided so that the stage 52 is disposed opposite to the top plate 54. The stage 52 contains a temperature control unit (not shown) disposed therein, so that the stage can function as a hot plate. Further, one end of an exhaust pipe 53 is connected to the bottom portion of the vacuum container 50, and the other end of the exhaust pipe 53 is connected to a vacuum pump 55.

One Embodiment of RLSA

Figure 4:
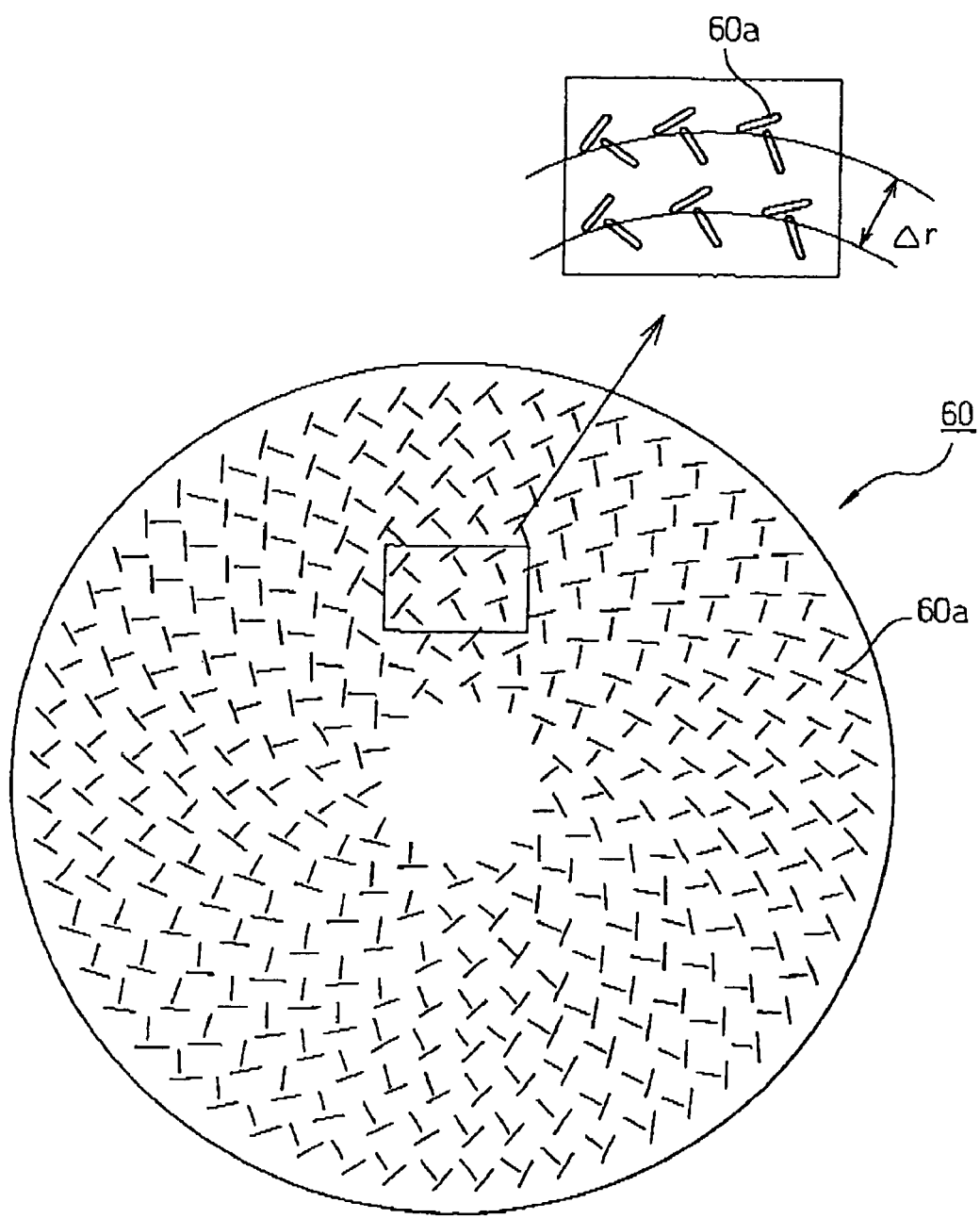
FIG. 4 is a schematic plan view showing an example of RLSA, which is usable in the process and apparatus for forming an underlying insulating film according to the present invention.

FIG. 4 is a schematic plan view showing an example of RLSA 60 which is usable in an apparatus for producing an electronic device material according to the present invention.

As shown in this FIG. 4, on the surface of the RLSA 60, a plurality of slots 60a, 60a, . . . are provided in the form of concentric circles. Each slot 60a is a substantially square penetration-type groove. The adjacent slots are disposed perpendicularly to each other and arranged so as to form a shape of alphabetical "T"-type character. The length and the interval of the slot 60a arrangement are determined in accordance with the wavelength of the microwave supplied from the microwave power supply unit 61.

One Embodiment of Heating Reaction Furnace

Figure 5:
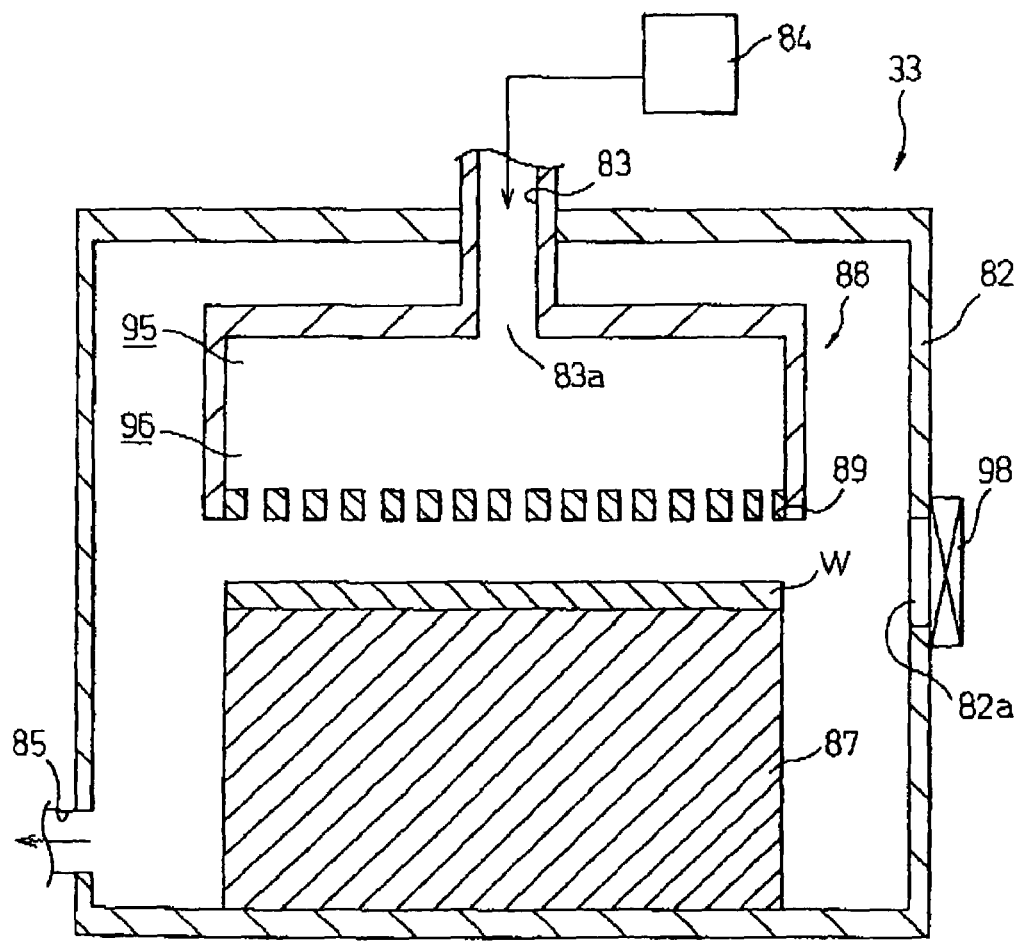
FIG. 5 is a schematic vertical sectional view showing an example of the heating reaction furnace unit, which is usable in the process for forming an underlying insulating film according to the present invention.

FIG. 5 is schematic sectional view in the vertical direction showing an example of the heating reaction furnace 47 which is usable in an apparatus for producing an electronic device material according to the present invention.

As shown in FIG. 5, a processing chamber 82 of the heating reaction furnace 47 chamber is formed into an air-tight structure by using aluminum, for example. A heating mechanism and a cooling mechanism are provided in the processing chamber 82, although these mechanisms are not shown in FIG. 5.

As shown in FIG. 5, a gas introduction pipe 83 for introducing a gas into the processing chamber 82 is connected to the upper central portion of the processing chamber 82, the inside of the processing chamber 82 communicates with the inside of the gas introduction pipe 83. In addition, the gas introduction pipe 83 is connected to a gas supply source 84. A gas is supplied from the gas supply source 84 into the gas introduction pipe 83, and the gas is introduced into the processing chamber 82 through the gas introduction pipe 83. As the gas in this case, it is possible to use one of various gas such as raw material for forming a high-k insulating film such as HTB and silane, for example. As desired, it is also possible to use an inert gas as a carrier gas.

A gas exhaust pipe 85 for exhausting the gas in the processing chamber 82 is connected to the lower portion of the processing chamber 82, and the gas exhaust pipe 85 is connected to exhaust means (not shown) such as vacuum pump. Due to the exhaust means, the gas in the processing chamber 82 is exhausted through the gas exhaust pipe 85, and the processing chamber 82 is maintained at a desired pressure.

In addition, a stage 87 for carrying the wafer W is provided in the lower portion of the processing chamber 82.

In the embodiment as shown in FIG. 5, the wafer W is carried on the stage 87 by means of an electrostatic chuck (not shown) having a diameter which is substantially the same as that of the wafer W. The stage 87 contains a heat source means (not shown) disposed therein, to thereby constitute a structure wherein the surface of the wafer W to be processed which is carried on the stage 87 can be adjusted to a desired temperature.

The stage 87 has a mechanism which is capable of rotating the wafer w carried on the stage 87, as desired.

In FIG. 5, an opening portion 82a for putting the wafer W in and out with respect to the processing chamber 82 is provided on the surface of the right side of the processing chamber 82 in this figure. The opening portion 82a can be opened and closed by moving a gate valve 98 vertically (up and down direction) in this figure. In FIG. 5, a transportation arm (not shown) for transporting the wafer is provided adjacent to the right side of the gate valve 98. In FIG. 5, the wafer W can be carried on the stage 87, and the wafer W after the processing thereof is transported from the processing chamber 82, as the transportation arm enters the processing chamber 82 and goes out therefrom through the medium of the opening portion 82a.

Above the stage 87, a shower head 88 as a shower member is provided. The shower head 88 is constituted so as to define the space between the stage 87 and the gas introduction pipe 83, and the shower head 88 is formed from aluminum, for example.

The shower head 88 is formed so that the gas exit 83a of the gas introduction pipe 83 is positioned at the upper central portion of the shower head 88. The gas is introduced into the processing chamber 82 through gas feeding holes 89 provided in the lower portion of the shower head 88.

Embodiment of MOS Transistor Formation

Hereinbelow, there is described a preferred example of the process wherein an MOS-type transistor comprising a wafer W having thereon an insulating film 2 comprising a high-k insulating film 22 and an underlying oxide film 21 is formed by using the above-mentioned apparatus.

FIGS. 6 to 13 are schematic views each showing an example of each step in the process according to the present invention.

Figure 6:
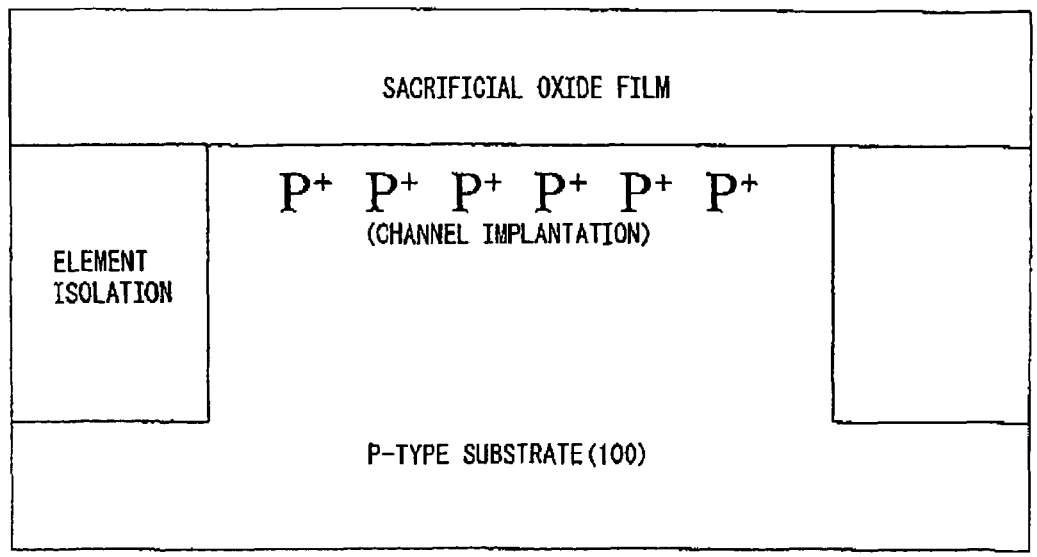
FIG. 6 is a schematic sectional view showing an example of the silicon substrate on which a gate oxide film or gate insulating film is to be formed.

Referring to FIG. 6, a field oxide film, a channel implant and a sacrificial oxide film are formed on the wafer W surface so as to provide an element isolation (or device isolation) in a previous step. The.

Figure 8:
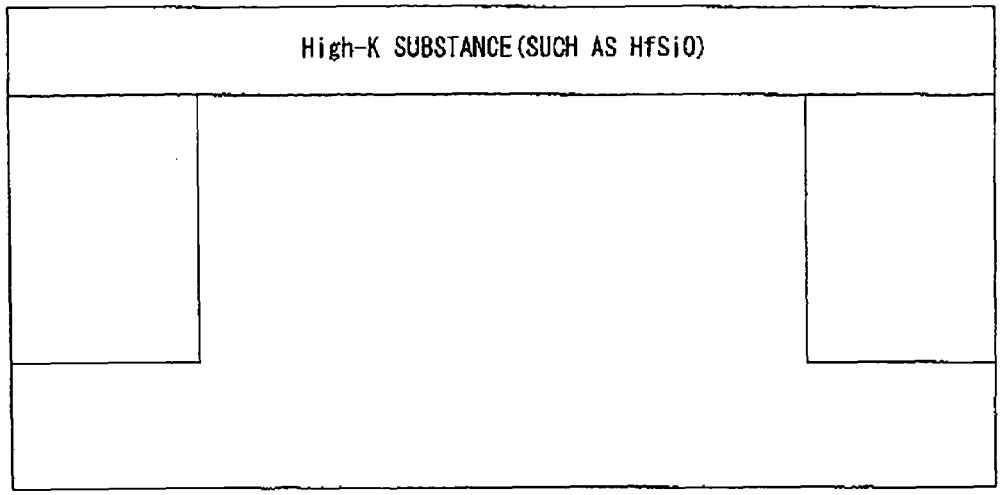
FIG. 8 is a schematic sectional view showing an example of the formation of a high-k material film.
Figure 9:
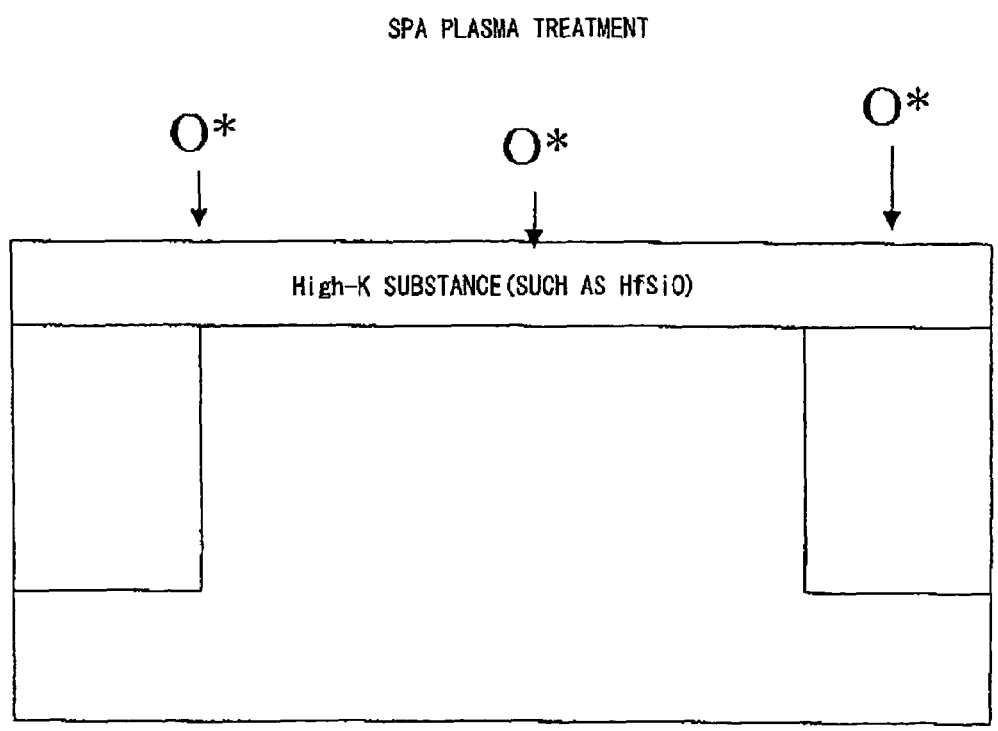
FIG. 9 is a schematic sectional view showing an example of the plasma processing to be effected on a high-k material.

Subsequently, a gate valve (not shown) provided at the side wall of the vacuum container 50 in the plasma processing unit 32 (FIG. 3) is opened, and the above-mentioned wafer Was shown in FIG. 8, from which the sacrificial oxide film has been removed, is placed on the stage 52 (FIG. 3) by means of transportation arms 37 and 38.

Next, the gate valve was closed so as to seal the inside of the vacuum container 50, and then the inner atmosphere therein is exhausted by the vacuum pump 55 through the exhaust pipe 53 so as to evacuate the vacuum container 50 to a predetermined degree of vacuum and a predetermined pressure in the container 50 is maintained. On the other hand, microwave (e.g., of 2 W/cm$^2$) is generated by the microwave power supply 61, and the microwave is guided by the waveguide so that the microwave is introduced into the vacuum container 50 via the RLSA 60 and the top plate 54, whereby radio-frequency plasma is generated in the plasma region P of an upper portion in the vacuum container 50.

Herein, the microwave is transmitted in the rectangular waveguide 63D in a rectangular mode, and is converted from the rectangular mode into a circular mode by the coaxial waveguide converter 63C. The microwave is then transmitted in the cylindrical coaxial waveguide 63B in the circular mode, and transmitted in the circular waveguide 63A in the expanded state, and is emitted from the slots 60a of the RLSA 60, and penetrates the plate 54 and is introduced into the vacuum container 50. In this case, microwave is used, and accordingly high-density plasma can be generated. Further, the microwave is emitted from a large number of slots 60a of the RLSA 60, and accordingly the plasma is caused to have a high density.

Figure 7:
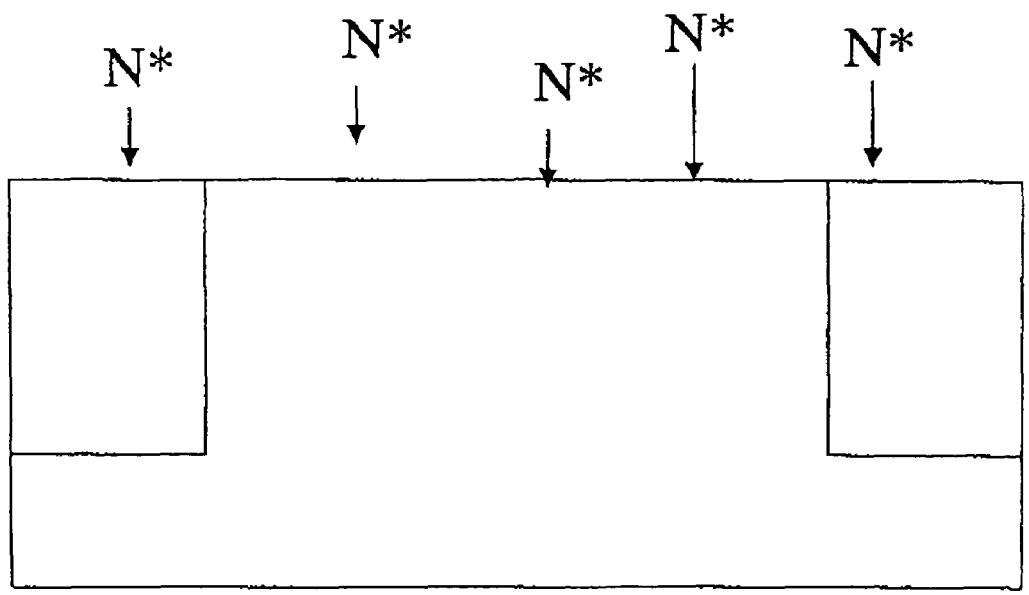
FIG. 7 is a schematic sectional view showing an example of the plasma processing to be effected on the surface of a substrate.

In advance of the introduction of the microwave, the step of FIG. 7 (nitridation treatment before the formation of a high-k film) is performed by introducing a rare gas such as krypton or argon, which is a process gas for the formation of an oxide film, and an $N_2$ gas from the gas supply tube 72 at a flow rate of, for example, 1,000 sccm and 40 sccm, respectively, while heating the wafer W, for example, at 400° C. by controlling the temperature of the stage 52. When this treatment is conducted, the substrate silicon can be prevented from reacting with a high-k substance at the formation of the high-k film to form a silicon oxide film at the interface therebetween.

Then, the wafer is set in a heat treatment unit 47. In this heat treatment unit 47, a film of a high-k substance is formed on the upper part of the wafer W. For example, in a case where a film of hafnium silicate (HfSiO) is formed on the silicon substrate W, tertiary ethoxy hafnium (HGB: $Hf(OC_2H_5)_4$) and a silane gas ($SiH_4$) are introduced at 1 sccm and 400 sccm, respectively, and the pressure is kept at 50 Pa. The flow rate of HGB is the flow rate of a liquid mass-flow controller and the flow rate of the silane gas is the flow rate of a gas mass-flow controller. In this atmosphere, the above-mentioned silicon substrate is heated at 350° C. and the reactive species Hf, Si and O are reacted on the substrate to form an HfSiO film. By controlling the process conditions including the treatment time, an HfSiO film of 4 nm is formed (FIG. 8).

Thereafter, a gate valve (not shown) is opened and transportation arms 37 and 38 (FIG. 2) are introduced into the vacuum container 47 so that they receive the wafer W. The transportation arms 37 and 38 take out the wafer W from the heat treatment unit 47 and then set the wafer on the stage in the plasma processing unit 33.

Embodiment of Nitride-Containing Layer Formation

Figure 11:
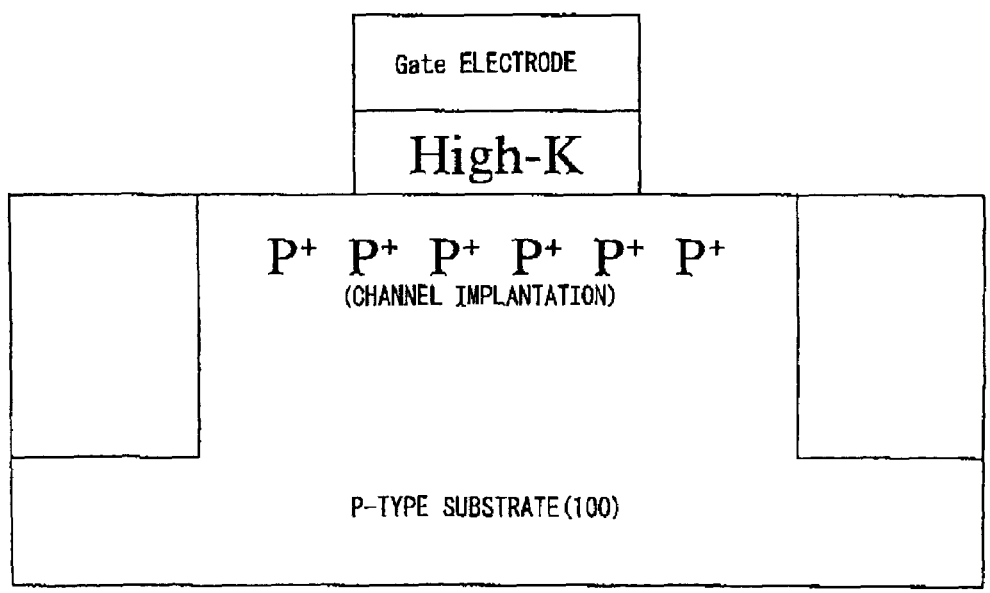
FIG. 11 is a schematic sectional view showing an example of the formation of an MOS capacitor.

Subsequently, as shown in FIG. 11, the surface of the wafer W is subjected to an oxidation treatment in the plasma processing unit 33, and an underlying oxide film 21 (FIG. 1(b)) is formed on the bottom surface of the previously formed high-k insulating film 2.

At the formation of this underlying oxide film, the conditions in the vacuum container 50, for example, are set such that the wafer temperature is, for example, 400° C. and the process pressure is, for example, 133 Pa (1 Torr), and an argon gas and an $O_2$ gas are introduced into the container 50 from the gas introduction pipe at a flow rate of, for example, 2,000 sccm and 200 sccm, respectively.

At the same time, a microwave of, for example, 2 W/cm$^2$ is generated from a microwave power supply 61 and this microwave is guided by a wave-guide path and introduced into the vacuum container 50 through the RLSA 60b and the top plate 54, whereby high-frequency plasma is generated in the plasma region P in the upper region of the vacuum container 50.

In this process (the formation or the underlying oxide film), the gas introduced is converted into plasma to form oxygen radials, and the thus formed oxygen radials transmit through the high-k substance and react with the silicon substrate, to thereby form an $SiO_2$ film at the interface between the high-k substance and the silicon substrate. In this way, as shown in FIG. 1(b), the underlying oxide film 21 is formed at the interface between the high-k substance 22 and the silicon substrate 1 on the wafer W.

Embodiment of Gate Electrode Formation

Figure 10:
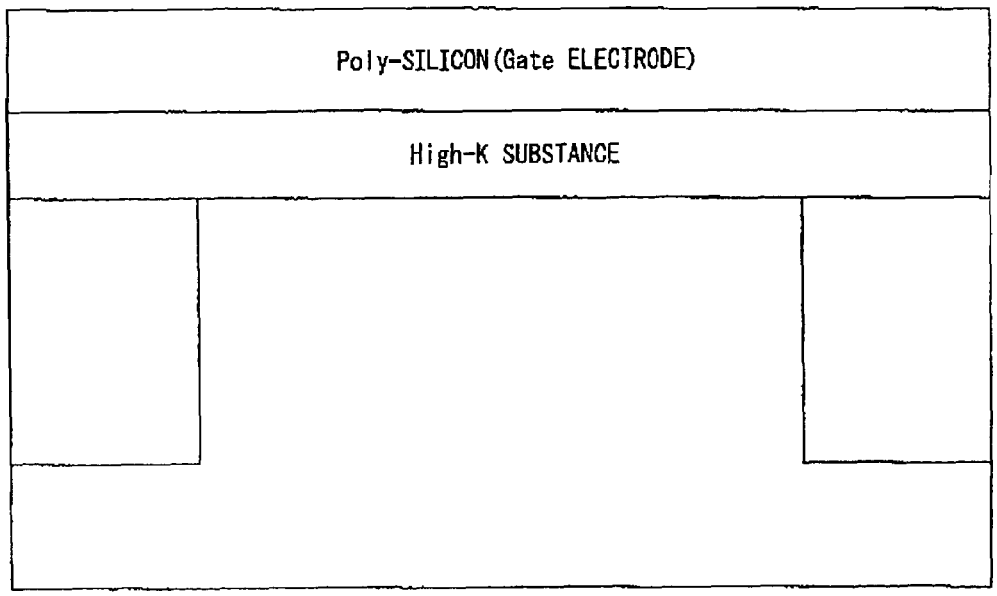
FIG. 10 is a schematic sectional view showing an example of the formation of a gate electrode on a high-k material film.

Then, a gate electrode 13 (FIG. 1(a)) is formed on the wafer, on which the high-k substance and the underlying oxide film have been formed (FIG. 10). This gate electrode is formed in a heat treatment unit of the same type as shown in FIG. 5. This heat treatment unit is sometimes installed integrally with the semiconductor production apparatus 30 shown in FIG. 2, or the treatment is sometimes performed in a separate apparatus.

At this time, the treatment conditions can be selected according to the kind of the gate electrode 13 to be formed.

More specifically, in a case where a gate electrode 13 comprising polysilicon is formed, the treatment is preformed by using, for example, $SiH_4$ as the process gas (electrode-forming gas) under the conditions such that the pressure is from 10 to 500 Pa and the temperature is from 580 to 680° C.

In a Case where a gate electrode 13 comprising amorphous silicon is formed, the treatment is preformed by using, for example, $SIH_4$ as the process gas (electrode-forming gas) under the conditions such that the pressure is from 10 to 500 Pa and the temperature is from 500 to 580° C.

(Quality of Oxide Film)

In the above-mentioned step of FIG. 11, at the time of the formation of an underlying oxide film for the gate underlying film, plasma containing oxygen ($O_2$) and rare gas is formed by supplying microwave on the wafer W mainly comprising Si through a plane antenna member (RLSA) in the presence of a process gas, and by using the thus formed plasma, an oxide film is formed on the surface of the substrate to be treated, so that the oxide film can have a high quality and the film quality can be successfully controlled.

Figure 12:
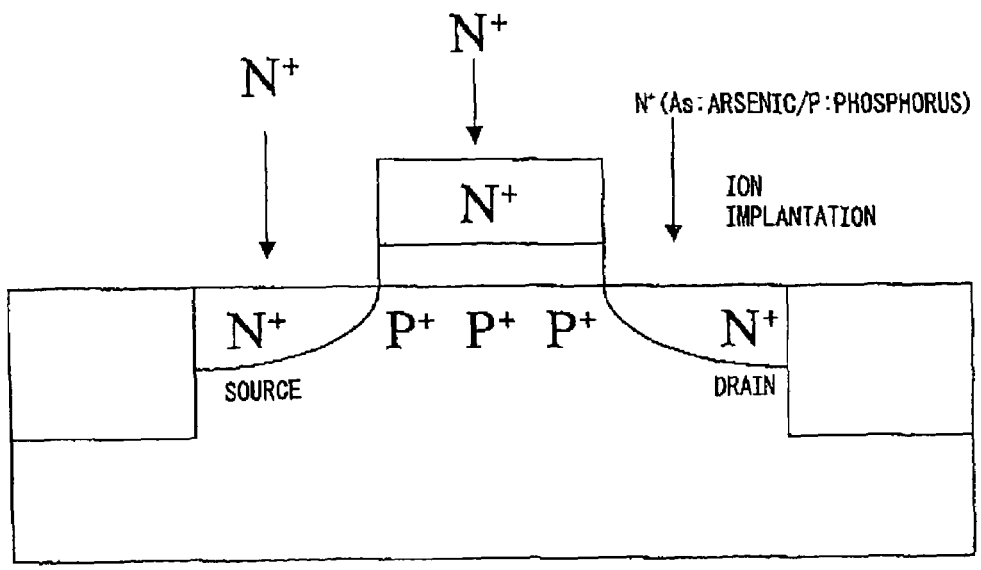
FIG. 12 is a schematic sectional view showing an example of the formation of a source and a drain by ion implantation.
Figure 13:
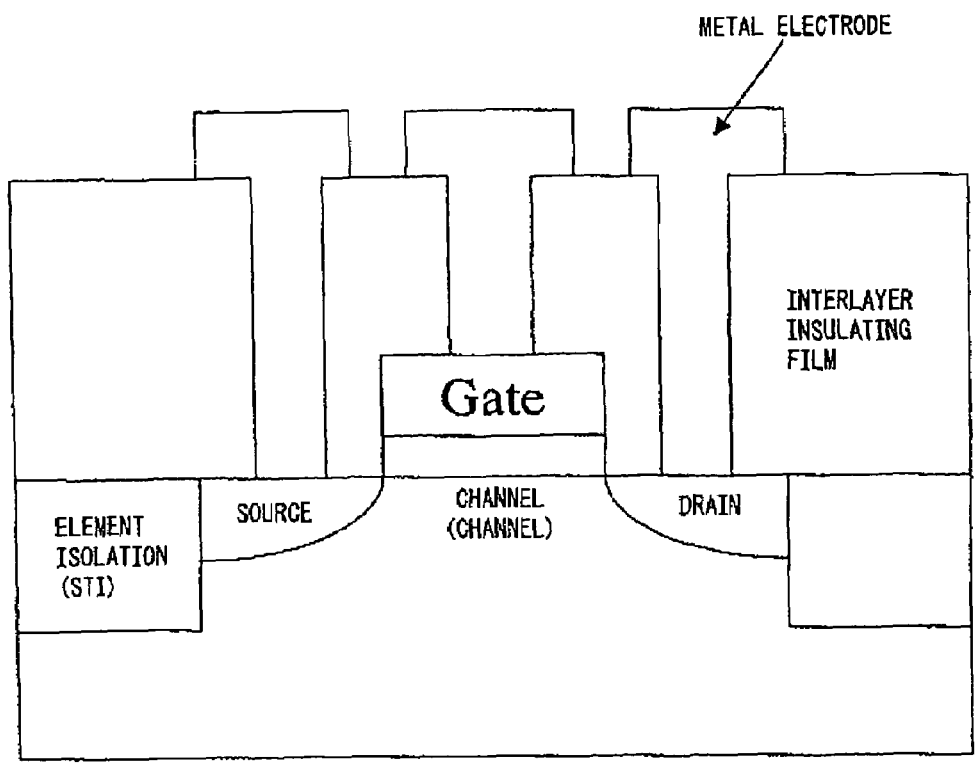
FIG. 13 is a schematic sectional view showing an example of the structure of an MOS-type transistor, which is obtainable by the present invention.

Thereafter, patterning and selective etching for a gate are performed to form an MOS capacitor (FIG. 11), and the resultant product is then subjected to ion implantation to form a source and a drain (FIG. 12). Subsequently, the dopant (for example, phosphorus (P), arsenic (As) and boron (B), etc., which have been implanted into the channel, source and drain) is activated by annealing, and then the resultant product is subjected to a wiring step as a post step by combining interlayer insulating film formation, patterning, selective etching and metal film formation. In this way, an MOS-type transistor according to this embodiment is obtained (FIG. 13). Finally, the upper part of the resultant transistor is subjected to a wiring step by using various patterns to form a circuit, to thereby complete a logic device.

In this embodiment, Hf silicate (HfSiO film) is formed as the insulating film, but an insulating film having another composition may also e formed. As for the gate insulating film, it is possible to use one or more kinds selected from the group consisting of; $SiO_2$, SiON, each having a low dielectric constant, which have been heretofore used, SiN having a relatively high dielectric constant, $Al_2O_3$, $ZrO_2$, $HfO_2$, $Ta_2O_5$, each having a high dielectric constant, which are called a high-k substance, silicates such as ZrSiO and HfSiO, and aluminates such as ZrAlO.

In addition, only the thermal CVD process is described as a practical example of the film-formation process for the high-k substance, but an arbitrary process may be used for the film formation of the high-k substance. For example, the film formation can be also performed by plasma CVD or PVD process.

Further, in this example, only the effect by the plasma oxidation treatment is noted, but the present invention is also applicable to, for example, plasma nitridation treatment, or a treatment comprising a combination of plasma oxidation treatment and plasma nitridation treatment, instead of the plasma oxidation treatment.

Hereinbelow, the present invention will be described in more detail with reference to Examples.

EXAMPLES

Example 1

Figure 14:
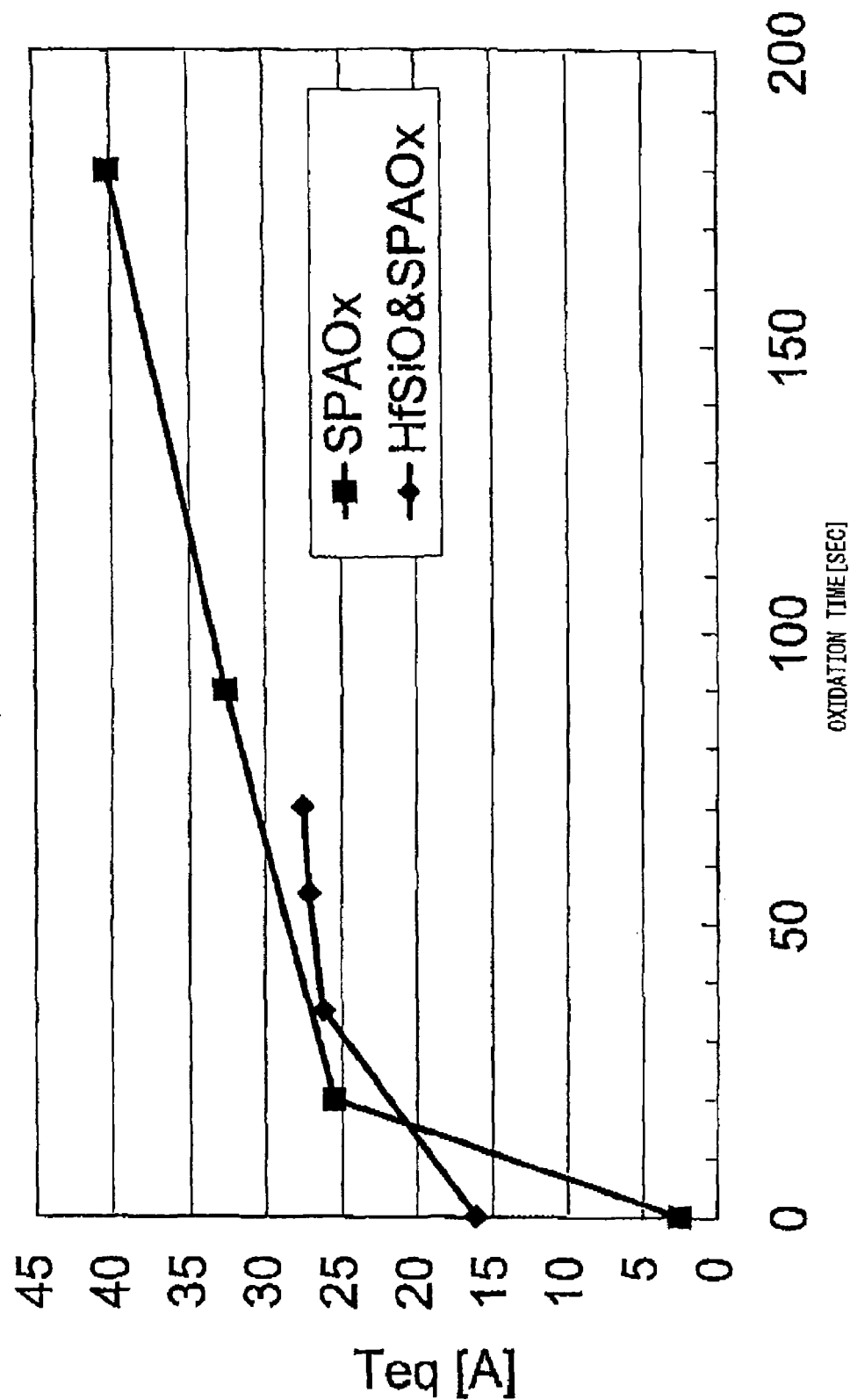
FIG. 14 is a graph showing a change in the electrical film thickness (Teq) and uniformity in the electrical film thickness, with respect to the oxidation time, when the surface of an HfSiO film and an oxide film formed by an RLSA oxidation process is subjected to an oxidizing plasma processing.
Figure 15:
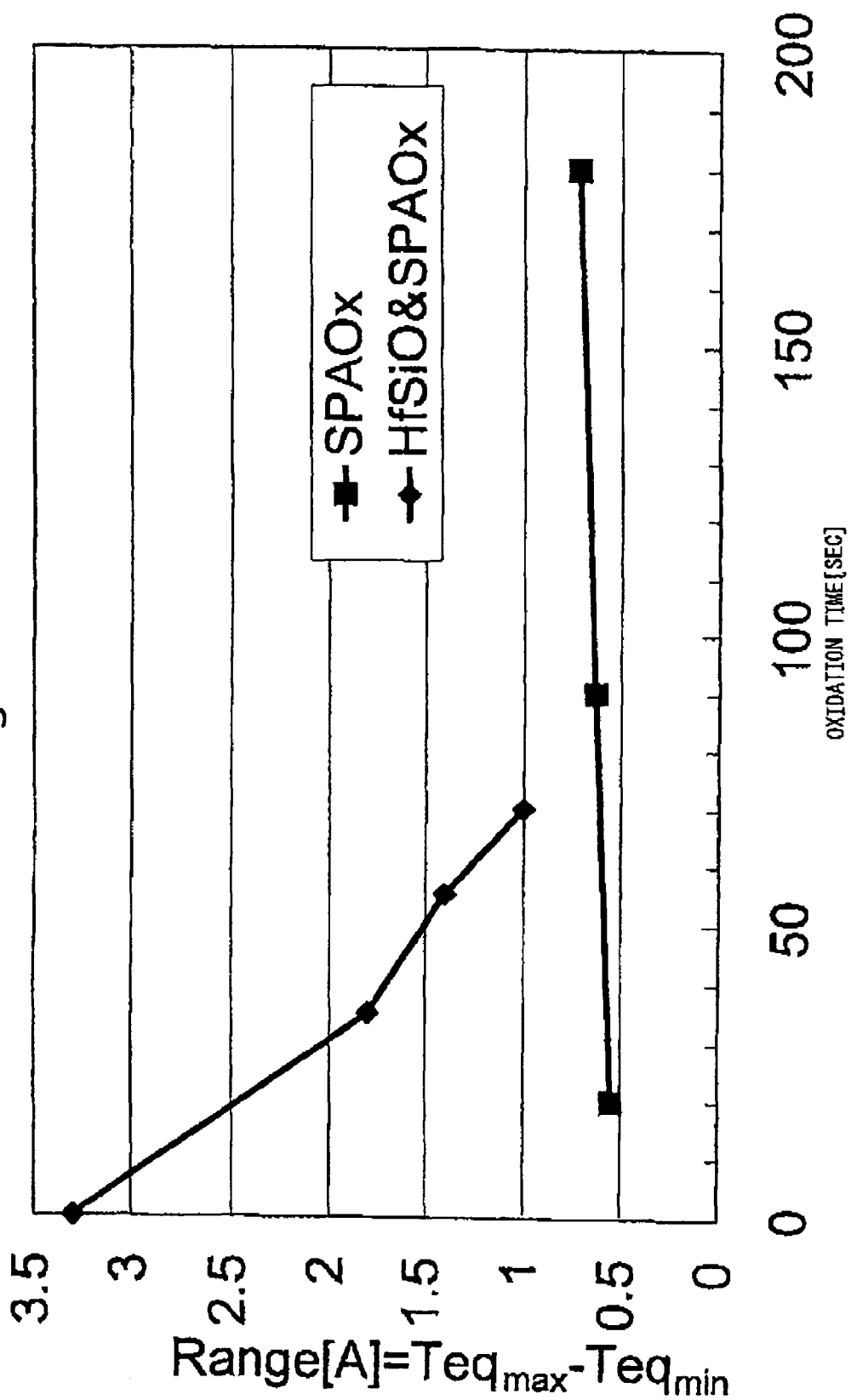
FIG. 15 is a graph showing a change in the electrical film thickness (Teq) and uniformity in the electrical film thickness, with respect to the oxidation time, when the surface of an HfSiO film and an oxide film formed by an RLSA oxidation process is subjected to an oxidizing plasma processing.

FIG. 14 and FIG. 15 show a change in the electrical film thickness (Teq) and in the uniformity of the electrical film thickness (range: difference between the maximum and minimum values of in-plane Teq), respectively, with respect to the oxidation time, when an oxidizing plasma processing is applied onto the HfSiO film and the oxide film formed by an RLSA oxidation process. Samples as shown in FIGS. 14 and 15 were produced by the following process.

(1) Substrate

A p-type silicon substrate having a resistivity of 8 to 12 Ωcm and a plane direction of (100) was used as the substrate. On the surface of the silicon substrate, a 500 A-sacrificial oxide film was formed by a thermal oxidization process.

(2) Pretreatment for HfSiO Film Formation

The sacrificial oxide film and contaminant factors (metals, organic materials and particles) were removed by RCA washing using a combination of APM (a mixed solution of ammonia, aqueous hydrogen peroxide and pure water), HPM (a mixed solution of hydrochloric acid, aqueous hydrogen peroxide and pure water) and DHF (a mixed solution of hydrofluoric acid and pure water). The chemical concentration ratio of the APM was $NH_4OH:H_2O_2:H_2O=1:2:10$ and the temperature was 60° C. The concentration ratio of the HPM was $HCl:H_2O_2:H_2O1:1:5$ and the temperature was 60° C. The concentration ratio of the DHF was $HF:H_2O=1:9$ and the temperature was 23° C. In the treatment, APM: 10 minute→pure water rinsing: 5 minutes→DHF: 23 minutes→pure water rinsing: 5 minutes→HPM: 10 minute→pure water rinsing: 5 minute→final pure water rinsing: 10 minutes were performed. Thereafter, IPA (isopropyl alcohol, 220° C.) drying was performed for 9 minutes to dry the water content on the wafer. The resulting substrate was kept at 700° C. and kept for 1 minute in an atmosphere (atmospheric pressure) where $NH_3$ was introduced at 2,000 sccm, to thereby form a thin nitride layer (SiN layer) on the substrate surface. Due to the formation of the SiN layer, the silicon substrate and the HfSiO film can be prevented from a thermal reaction.

(3) HfSiO Film Formation

On the silicon substrate in the above (2), a hafnium silicate (HfSiO) film was formed. Tertiary ethoxy hafnium (HTB: $Hf(OC_2H_5)_4$) and silane gas ($SiH_4$) were introduced at 1 sccm and 400 sccm, respectively, and the pressure was kept at 50 Pa. The flow rate of HGB was the flow rate of a liquid mass-flow controller and the flow rate of silane gas was the flow rate of a gas mass-flow controller. In this atmosphere, the silicon substrate in the above (2) was heated at 350° C. and the reactive species Hf, Si and O were reacted oh the substrate to form an HfSiO film. By controlling the process conditions including the treatment time, an HfSiO film of 4 nm was formed.

(4) RLSA Oxidation Treatment

The silicon substrate treated in the above (3) step was then subjected to an RLSA plasma oxidation treatment. On the silicone substrate heated at 400° C., a rare gas and oxygen were flown at 2,000 sccm and 200 sccm, respectively, and the pressure was kept at 67 Pa (500 mTorr). In this atmosphere, microwave of 2.8 W/cm$^2$ was supplied through a plane antenna member (RLSA) to form plasma containing oxygen and rare gas, and by using the thus formed plasma, a plasma oxidation treatment was applied onto the substrate in the above (3).

(5) TiN Film Formation for Gate Electrode

On the HfSiO film which had been formed through (3) and (4) steps and as a reference, on an oxide film which had been formed by performing only the oxidation treatment of (4) but omitting the HfSiO film formation of (3), a titanium nitride (TiN) film was formed as a gate electrode by a CVD process. The silicon substrate which had been treated in the above (3) and (4) steps was heated at 550° C. and under a pressure of 200 Pa, TiCl$_4$ gas, NH$_3$ gas and N$_2$ gas were introduced on the substrate at 30 sccm, 100 sccm and 150 sccm, respectively, whereby a 800 A-thick TiN film for an electrode was formed on the HfSiO film.

(6) Patterning, Gate Etching

The TiN electrode which had been formed in the above (5) step was subjected to patterning by lithography and then, the silicon substrate was soaked in an aqueous hydrogen peroxide (H$_2$O$_2$) chemical solution for 90 minutes to dissolve the TiN in the non-patterned portion, to thereby form an MOS capacitor.

Example 2

The Cv property of the MOS capacitor which had been produced in Example 1 was evaluated. This measurement was performed by the following process. The CV property was evaluated for a capacitor having a gate electrode area of 10,000 μm$^2$. The CV property was determined by evaluating the capacitance at each voltage in the process of sweeping the gate voltage from 1 V to about −2 V at a frequency of 1 MHz. From the thus determined CV property, the electrical film thickness was calculated.

FIG. 14 shows an electrical film thickness (Teq) when an oxidizing plasma processing is applied onto the HfSiO film and the oxide film formed by an RLSA oxidation process. The abscissa indicates an oxidation treatment time and the ordinate indicates an electrical film thickness (Teq).

As shown in FIG. 14, the reference oxide film reaches a film thickness of 25 A when the oxidation time is 20seconds or more. As the treatment time is shorter, the reproducibility of the process becomes lower, and the control of the film thickness also becomes more difficult. Therefore, a short-time process of 20 seconds or less is not practical. This reveals that the film thickness (10 A or less) to be required as a high-k oxynitride film can be hardly obtained by the normal oxidation process as shown in the reference of FIG. 14. On the other hand, when the RLSA oxidation treatment is applied to an HfSiO film as shown in FIG. 14, even if a long-time treatment of 35 seconds or more is applied, the increase in the electrical film thickness is as small as about 10 A, based on the initial film thickness (about 16 A). Only a rare gas and an oxygen gas are used for the oxidation process, and therefore it is considered that this film thickness increase is attributable to oxygen. It is considered that the film thickness increase may include the film thickness increase from the interface and the film thickness increase in the film itself (hulk). At present, crystallization due to high-temperature annealing is known as a problem of the high-k substance including HfSiO film. This crystallization is considered to occur due to a small absolute amount of Si atoms in the film. In this meaning, the film thickness increase resulting from the mingling or mixing of oxygen into the film is unlikely the film thickness increase resulting from the insertion of O atoms into the Si—Si bonds. Also, as is known in general, the Hf—O bonds are abundantly contained. From these, the matter most greatly contributing to the film thickness increase may highly probably be the film thickness increase from the substrate, that is, the formation of an oxide film at the interface. Accordingly, it is considered that a very thin oxide film can be formed at the interface by the present invention.

FIG. 15 shows a change in the uniformity of the electrical film thickness (range: difference between the maximum and minimum values of in-plane Teq) when an oxidizing plasma processing is applied onto the HfSiO film and the oxide film formed by the RLSA oxidation process. The abscissa indicates the oxidation treatment time and the ordinate indicates the range.

As shown in FIG. 15, in a case where the reference RLSA oxide film, the range value is less changed with respect to the treatment time, but when the RLSA oxidation treatment is applied to the HfSiO film, the range becomes smaller, that is, the uniformity is further improved, as the treatment time is increased. The mechanism therefor is considered as follows. When the film thickness increase is mainly due to the formation of the oxide film at the interface as described above, a strong thickness increase effect is provided in the thin portion of film and a weak thickness increase effect is provided in the thick portion of film. Therefore, it can be considered that the non-uniformity in the film thickness is improved by applying RLSA oxidation and a uniform electrical film thickness is obtained. The results of FIG. 15 can support the above-mentioned mechanism of film thickness increase in FIG. 14.

As understood from the above, by applying plasma oxidation treatment after forming an HfSiO film, a very thin underlying film of 10 A or less can be realized, although such a thickness has been difficult to be realized by an oxidation process of a simple substance, and at the same time, an HfSiO film having a good uniformity can be formed.

In the above Examples, only an HfSiO film produced by using the present invention is referred to, but the same effect can be obtained by applying the same treatment to other high-k substances.

INDUSTRIAL APPLICABILITY

As described hereinabove, the present invention can provide a process of providing a good underlying film at the interface between an insulating film and an electronic device substrate, so that the thus formed underlying film can improve the property of the insulating film.

The invention claimed is:

1. A method for forming an insulating film, comprising:
   plasma nitriding a surface of a substrate before formation of a high-dielectric constant insulating film,
   forming a high-dielectric constant insulating film on the substrate,
   generating plasma based on a process gas comprising at least an oxygen atom-containing gas on the high-dielectric constant insulating film,
   irradiating the surface of the high-dielectric constant insulating film with the plasma to thereby form an oxide film at the interface between the high-dielectric constant insulating film and the substrate, and nitriding the surface of the high-dielectric constant insulating film after formation of the oxide film, wherein the oxide film has a thickness of 6-12 Å.

2. A method for forming an insulating film according to claim 1, wherein the plasma is generated based on microwave via a plane antenna member (RLSA) having a plurality of slots.

3. A method for forming an insulating film according to claim 1, wherein the high-dielectric constant insulating film comprises at least one material selected from the group consisting of $Al_2O_3$, $ZrO_2$, $HfO_2$, $Ta_2O_5$, ZrSiO, HfSiO and ZrAlO.

4. A method for forming an insulating film according to claim 1, wherein the process gas comprises at least one rare gas selected from the group consisting of Kr, Ar, He and Xe, wherein the oxygen atom-containing gas is $O_2$ gas.

5. A method for forming an insulating film according to claim 1, further comprising annealing the substrate after the formation of the oxide film, wherein the annealing is conducted at a temperature of 500-1100° C.

6. A method for forming an insulating film according to claim 5, wherein the annealing is conducted in an atmosphere of $N_2$, $O_2$, or N2 and $O_2$.

7. A method for forming an insulating film, comprising: plasma nitriding a surface of a substrate before formation of a HfSiO film on the substrate, forming a HfSiO film on the substrate, generating plasma based on a process gas comprising at least an oxygen atom-containing gas on the HfSiO film, and irradiating the surface of the HfSiO film with the plasma, to thereby form an oxide film at the interface between the HfSiO film and the substrate, wherein the oxide film has a thickness of 6-12 Å.

8. A method for forming an insulating film according to claim 7, wherein the oxygen atom-containing gas is $O_2$ gas and the process gas comprises at least one rare gas selected from the group consisting of Kr, Ar, He and Xe.

9. A method for forming an insulating film according to claim 7, further comprising annealing the substrate after formation of the oxide film, wherein the annealing is conducted at a temperature of 60-1100° C.

10. A method for forming an insulating film according to claim 9, wherein the annealing is conducted in an atmosphere of $N_2$, $O_2$, or N2 and $O_2$.

11. A method for forming an insulating film according to claim 7, wherein the substrate is at a temperature from room temperature to 500° C., wherein the oxide film is formed at a pressure of 3-500 Pa.

12. A method for forming an insulating film according to claim 7, wherein the HfSiO film is formed by using tertiary ethoxy hafnium (HTB: $Hf(OC_2H_5)_4$) and silane gas ($SiH_4$).

13. A method for forming an insulating film according to claim 7, further comprising washing the substrate before the formation of the HfSiO film.

14. A method for forming an insulating film, comprising: plasma nitriding a surface of a substrate before formation of a HfSiO film, forming a HfSiO film on the substrate, generating plasma based on a process gas comprising at least an oxygen atom-containing gas on the HfSiO film, irradiating the surface of the HfSiO film with the plasma to thereby form an oxide film at the interface between the HfSiO film and the substrate, and nitriding the surface of the HfSiO film, wherein the oxide film has a thickness of 6-12 Å.

15. A method for forming an insulating film according to claim 14, further comprising washing the substrate before the formation of the HfSiO film.

16. A method for forming an electronic device, comprising: forming a high-dielectric constant gate insulating film on a substrate, generating plasma based on a process gas comprising at least an oxygen atom-containing gas on the high-dielectric constant gate insulating film, irradiating a surface of the high-dielectric constant gate insulating film with the plasma, to thereby form an oxide film at the interface between the high-dielectric constant gate insulating film and the substrate, nitriding the surface of the high-dielectric constant gate insulating film after formation of the oxide film, and forming a gate electrode on the high-dielectric constant gate insulating film, wherein the oxide film has a thickness of 6-12 Å.

17. A method for forming an electronic device according to claim 16, further comprising annealing the surface of the high-dielectric constant gate insulating film after the formation of the oxide film.

18. A method for forming an electronic device according to claim 16, wherein the high-dielectric constant gate insulating film comprises at least one material selected from the group consisting of $Al_2O_3$, $ZrO_2$, $HfO_2$, $Ta_2O_5$, ZrSiO, HfSiO and ZrAlO.

19. A method for forming an electronic device according to claim 16, further comprising plasma nitriding the surface of the substrate before the formation of the high-dielectric constant gate insulating film.

* * * * *

UNITED STATES PATENT AND TRADEMARK OFFICE
CERTIFICATE OF CORRECTION

PATENT NO. : 7,622,402 B2
APPLICATION NO. : 10/509371
DATED : November 24, 2009
INVENTOR(S) : Sugawara et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 508 days.

Signed and Sealed this

Fourteenth Day of December, 2010

David J. Kappos
*Director of the United States Patent and Trademark Office*